TRANSISTOR PULSE AMPLIFIER WITH MEANS TO ELIMINATE
EFFECTS OF MINORITY CARRIER STORAGE
Filed July 2, 1956

INVENTOR.
ANTHONY M. KOJALOWICZ
BY William R. Lane
ATTORNEY 3,023,323
Patented Feb. 27, 1962

3,023,323

TRANSISTOR PULSE AMPLIFIER WITH MEANS TO ELIMINATE EFFECTS OF MINORITY CARRIER STORAGE

Anthony M. Kojalowicz, Long Beach, Calif., assignor to North American Aviation, Inc.

Filed July 2, 1956, Ser. No. 595,368
3 Claims. (Cl. 307—88.5)

Figure 1:
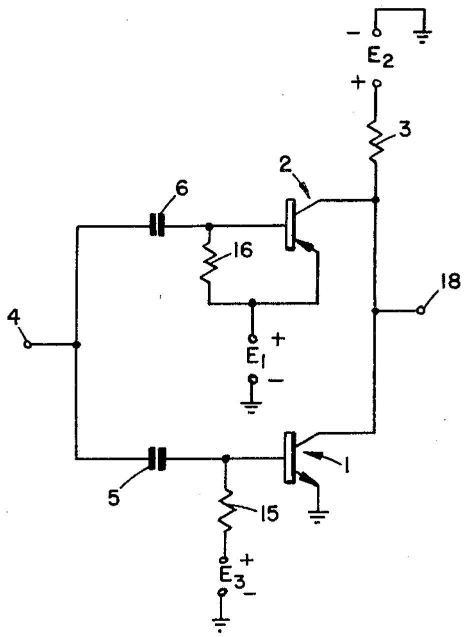

This invention relates to transistor amplifiers and more particularly to a transistor pulse amplifier with a fast rise and fall time characteristic.

In the design of circuits employing transistors, variations in transistor operation caused by changes in temperature and variation in the characteristics of the individual transistors seriously effect stability and sensitivity of the circuits. One of the more important problems presented by present day transistors is that of accurately controlling the output current in the transistor flowing out of either the emitter or collector whichever one is connected to provide an output to a load.

Although there is a substantial difference between the electrical properties of a transistor and the properties of a vacuum tube, there is a marked similarity in the operation. Generally speaking, the cathode, grid and anode electrodes of a vacuum tube triode correspond respectively to the emitter, base and collector electrodes of a transistor. In a P-N-P transistor, for example, the emitter and collector electrodes contain an excess of positive carriers, or holes, and the base electrode contains an excess of negative carriers, or electrons. The excess electrons in the base are called majority carriers and the holes which might be injected into the base by the emitter are called minority carriers. When the collector is biased negatively with respect to the base and the emitter, and the emitter is biased positively with respect to the base, the holes in the emitter are injected as minority carriers into the base. Some of these injected minority carriers will diffuse through the base and be attracted to the collector, increasing the collector current. When the transistor is saturated by a signal on the base there results a large concentration of minority carriers arriving at the collector-base junction. Because of the large current in the collector there will be a large voltage drop across the load resistance commonly connected to the collector. Because of this large voltage drop the voltage of the collector in reference to the base remains small. With a relatively small collector voltage not all of the minority carriers arriving at the collector-base junction pass through to the collector and some of the excess minority carriers are then stored in the base. When the saturating signal is removed, the excess minority carriers in the base will drift into the collector slowly. Consequently, a collector current is maintained, even after the signal voltage applied to the base drops to zero, until the excess minority carriers in the base-collector region are dissipated through the collector. For purposes of discussion it is assumed that the collector of the transistor is connected to the output load circuit. A minority carrier storage effect will also occur between the base and the emitter if the emitter circuit is connected to the output load. This process of a continuing collector or emitter current after removal of the signal voltage is known as the minority carrier storage effect. The above-described minority carrier storage effect discussion also applies for an N-P-N transistor in which case the electrons injected from the N emitter into the P base are the minority carriers. Except for the aforementioned polarity change, operation in an N-P-N transistor is the same as in a P-N-P transistor. The minority carrier storage effect is highly undesirable in transistor circuits which require the output current supplied by the collector to turn off a short time after the input signal to the base of the transistor is removed, as for example in pulse type circuits used in digital computers.

In the past, circuits to compensate for the aforementioned undesirable carrier storage effect have involved a considerable number of components which provide the transistor with a negative bias when the input signal is removed. Designs utilizing complicated circuits to compensate for this undesirable effect have been made.

This invention contemplates a simple and reliable circuit which produces an amplified pulse output free from the effects of minority carrier storage. The embodiments of this invention utilize novel circuits which compensate for the flow of current in the collector after cutoff of the transistor and thereby provide a short rise and fall time in collector current output.

It is therefore an object of this invention to provide an improved transistor amplifier.

It is another object of this invention to provide a stable transistor pulse amplifier.

It is a further object of this invention to control the flow of current in the collector circuit of a transistor.

It is still another object of this invention to provide a circuit to compensate for the minority carrier storage effect in a transistor.

It is a still further object of this invention to provide a transistor pulse amplifier which produces an output pulse of short rise and fall time.

It is another object of this invention to provide a low impedance path for the excess minority carriers in the base of a transistor when said transistors ceases conduction.

Figure 2:
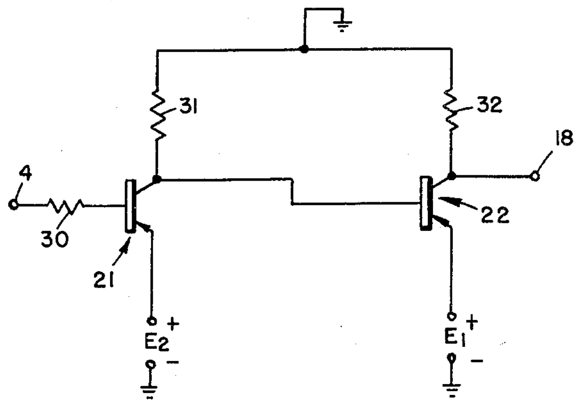

Other objects of invention will become apparent from the following description taken in connection with the accompanying drawings in which FIG. 1 is a schematic of the preferred embodiment of the invention;

And FIG. 2 is a schematic of a modified form of the device of the invention.

Referring to FIG. 1, the pulse amplifier is composed of transistors 1 and 2 whose bases are coupled to input terminal 4 by capacitors 5 and 6, respectively. The collectors of transistors 1 and 2 are connected in common to load resistor 3 which connects the collectors to D.-C. source $E_2$. The emitter of transistor 1 is connected to ground. The emitter of transistor 2 is connected to D.-C. source $E_1$ which is at a slightly more positive potential than D.-C. source $E_2$. The base of transistor 2 is returned through resistor 16 to D.-C. source $E_1$. The base of transistor 1 is connected through resistor 15 to D.-C. source $E_3$ which together with source $E_2$ establishes operating potentials on transistor 1. Source $E_3$ is at a sufficient positive potential with respect to the emitter to cause transistor 1 to saturate during conducting periods. As shown, transistor 1 is an N-P-N and transistor 2 is a P-N-P. If transistor 1 were P-N-P and transistor 2 N-P-N, the polarity connections of the D.-C. sources would be reversed, D.-C. source $E_3$ would be more negative than D.-C. source $E_2$, and D.-C. source $E_1$ would be more negative than ground.

In operation, assuming initially the absence of a pulse signal at input terminal 4, transistor 1 is conducting by reason of the application of a potential to the base of transistor 1 by D.-C. source $E_3$ which is positive with respect to the emitter of transistor 1. Current flows through the path described by D.-C. source $E_2$, resistor 3, the collector-emitter circuit of transistor 1 to ground. Because of the low impedance presented by transistor 1 to the flow of current when conducting, the potential level at the output terminal 18, taken from the collector circuit of transistor 1, is substantially at ground. Also initially, before a negative pulse signal is received at terminal 4, transistor 2 is not conducting since the base and emitter are commonly connected to D.-C. source $E_1$ which causes the base potential to be zero with respect to the emitter potential.

When a pulse of negative amplitude is presented to input terminal 4, the signal is passed to the bases of transistors 1 and 2 by capacitors 5 and 6, respectively. The negative potential of the base with respect to the emitter of transistor 1 is sufficient to cause the transistor to cease conducting. However, due to the presence of the minority carriers stored in the base near the collector-base junction of the formerly saturated transistor 1, current will still flow in the collector of transistor 1. The negative pulse appearing at the base of transistor 2 is sufficient to cause transistor 2 to immediately saturate, current flowing from D.-C. source $E_1$ through the emitter and into the collector of transistor 2. From the collector the current from conducting transistor 2 divides into two paths. The current flowing through resistor 3 to D.-C. source $E_2$ prevents $E_2$ from supplying current to the collector of transistor 1 because point 18 clamps to the voltage level of $E_1$ which is at a higher potential than $E_2$. A portion of the current also flows through the collector of transistor 2 into the collector of transistor 1 to supply the majority positive carriers for the minority carriers stored in the base of transistor 1. The collector current in transistor 1 is supplied by $E_1$ through transistor 2 until the stored minority carriers have completely dissipated. Thus in effect a current path is created from $E_1$ through the emitter-collector of transistor 2 to the collector-base of transistor 1 which provides a return path for the minority carriers stored in the base of transistor 1 during its conduction period.

After a short interval when the input pulse at terminal 4 disappears, transistor 1 resumes conduction since the base potential is again positive with respect to the emitter potential. Removing the negative potential from the base of transistor 2 causes the base to return to a zero potential with respect to the emitter. However, as in transistor 1, the carrier storage in the base of transistor 2 maintains a flow of current in the collector circuit. Part of the current flowing from D.-C. source $E_2$ through resistor 3 into the collector-emitter of transistor is now diverted to supply the collector current in transistor 2 for the period needed to dissipate the carriers stored in transistor 2. Thus it is readily apparent that transistors 1 and 2 act as switches controlled by input signals from terminal 4 to provide a minority carrier current path for each other.

The circuit described above and shown in FIG. 1 produces an amplified pulse which is substantially proportional in width to the input pulse and whose fall time is as good as its rise time. The carrier storage effect inherent in transistors 1 and 2 is not eliminated by the above circuit. However, the effects of the carrier storage which would cause a widening in the pulse width and also curved rising and leading edges are eliminated by using the conducting transistor to supply the collector current for the carrier storage effect in the nonconducting transistor. In comparison then with conventional pulse amplifiers, the circuit described above is substantially independent of the individual transistor characteristics in the circuit, whereas a conventional transistor pulse amplifier must bear the loss in stability and sensitivity of the circuit caused by the inherent carrier storage effect of the transistors.

FIG. 2 illustrates a different method of compensating for the current in the collector circuit caused by the carrier storage effect. Input terminal 4 is now connected through resistor 30 to the base of P-N-P transistor 21. The collector of transistor 21 is connected to the base of P-N-P transistor 22. The emitter of transistor 21 is supplied by D.-C. source $E_2$. The collector of transistor 21 is connected to ground through resistor 31. The emitter of transistor 22 is supplied by D.-C. source $E_1$ which is at a slightly higher potential than D.-C. source $E_2$ and supplies the operating potential to transistor 22 to control conduction thereof. The collector of transistor 22 is connected to ground through resistor 32. The amplifier pulse output is taken from the collector of transistor 22 at terminal 18.

In operation, during the absence of a signal at terminal 4, transistor 22 is conducting heavily and is saturated. An excess of positive minority carriers is present in the base near the collector base junction of transistor 22. Current is flowing from D.-C. source $E_1$ into the emitter and through the base into the collector circuit through resistor 32 to ground. The potential at output terminal 18 of the collector is equal to the potential of D.-C. source $E_1$. When a negative pulse signal is received at input terminal 4 and transmitted to the base of nonconducting transistor 21, the negative potential of the base with respect to the emitter causes transistor 21 to conduct into saturation. The potential of the collector of transistor 21 rises until it equals the potential at $E_2$. The potential at the base of transistor 22, which is directly connected to the collector of transistor 21, rises correspondingly cutting off transistor 22. The positive minority carriers in the base region near the collector of transistor 22 are attracted towards the $E_2$ supply through the conducting transistor 21 because of the low impedance presented by the collector-emitter of circuit of transistor 21. Therefore, current flows from the base of transistor 22 through the collector-emitter circuit of transistor 21 to D.-C. source $E_2$. By providing a low impedance connection to the base of transistor 22 at the time the transistor is cut off, the minority carriers stored in the base region near the collector of transistor 22 will be attracted through the collector-emitter circuit of transistor 21 to D.-C. source $E_2$. Therefore, the current in the collector of transistor 22 will fall sharply providing a fast fall time in the output pulse presented to terminal 18.

In FIG. 1, N-P-N transistor 1 and P-N-P transistor 2 may be replaced by a P-N-P and an N-P-N transistor, respectively, in which case, as noted previously, the B supply is reversed.

The device of this invention is especially suited in pulse circuits requiring a precise square wave output.

Although the invention has been described and illustrated in detail, it is to be clearly understood that the same is by way of illustration and example only and is not to be taken by way of limitation, the spirit and scope of this invention being limited only by the terms of the appended claims.

I claim:

1. In a transistor pulse amplifier, a first transistor, a second transistor, each of said transistors having at least collector, emitter, and base electrodes, a first current path comprising one side of a D.-C. source, an impedance, the collector-emitter circuit of said first transistor and the other side of said D.-C. source, a second current path comprising one side of a second D.-C. source, the emitter-collector circuit of said first transistor, and said one side of said first D.-C. source, means for applying a pulse to the bases of said transistors to cause said first transistor to conduct and said second transistor to be cut off, bias means responsively connected to the base of said second transistor to cause said second transistor to conduct in the absence of a pulse from said means for applying a pulse, said transistors being of oppositely conductive type whereby said second transistor provides the source of collector current for said first transistor when said first transistor ceases conducting.

2. The combination recited in claim 1 wherein the potential of said one side of said second D.-C. source is higher than the potential of said one side of said first D.-C. source whereby said second D.-C. source provides the source of collector current for said first transistor when said first transistor ceases conducting.

3. In a transistor amplifier, a first transistor having at least collector, emitter and base electrodes, a first source of D.-C. potential connected across said emitter and collector electrodes for establishing operating potentials thereon, a signal source for controlling the conduction of said first transistor a second source of D.-C. potential, a current path connecting one side of said second source to said collector electrode of said first transistor, said current path providing a minority current return path to said second D.-C. source, and switch means disposed in said current path, said switch means being responsive to said signal source controlling the conduction of said first transistor to allow flow of current through said current path when said transistor is nonconducting, said switch means comprising a second transistor having its collector-emitter circuit connected in said current path to control the flow of current therein, and bias means responsively connected to the base of said second transistor for allowing the flow of current through said second transistor in the absence of a signal from said signal source.

References Cited in the file of this patent

UNITED STATES PATENTS

| | | |
|---|---|---|
| 2,702,838 | Haynes | Feb. 22, 1955 |
| 2,782,267 | Beck | Feb. 19, 1957 |
| 2,791,644 | Sziklai | May 7, 1957 |
| 2,873,367 | Zawels | Feb. 10, 1959 |

OTHER REFERENCES

Sziklai: "Transistor Circuits and Applications," pub. in Electronic Engineering, September 1953, pages 358–364.

Shea: "Principles of Transistor Circuits," page 164, Sept. 15, 1953.